United States Patent
Chen et al.

(10) Patent No.: US 6,900,718 B2
(45) Date of Patent: May 31, 2005

(54) RESISTIVE SUPERCONDUCTING CURRENT LIMITER

(75) Inventors: Makan Chen, Rupperswil (CH); Willi Paul, Zürich (CH); Martin Lakner, Birmenstorf (CH); Jakob Rhyner, Davos (CH)

(73) Assignee: ABB Research LTD, Zurich (CH)

( * ) Notice: Subject to any disclaimer, the term of this patent is extended or adjusted under 35 U.S.C. 154(b) by 165 days.

(21) Appl. No.: 10/282,106

(22) Filed: Oct. 29, 2002

(65) Prior Publication Data

US 2003/0080849 A1 May 1, 2003

(30) Foreign Application Priority Data

Oct. 31, 2001 (EP) ............................................. 01811059

(51) Int. Cl.[7] ................................................ H01C 7/04
(52) U.S. Cl. ..................................... 338/32 S; 338/307
(58) Field of Search ............................. 338/325; 2/338

(56) References Cited

U.S. PATENT DOCUMENTS 6,344,956 B1    2/2002   Morita 6,420,955 B2 *  7/2002   Heismann et al. ............ 338/13

FOREIGN PATENT DOCUMENTS

| DE | 19746976 A1 | 5/1999 |
|---|---|---|
| DE | 19827225 C1 | 12/1999 |
| DE | 19832274 A1 | 1/2000 |
| JP | 05226707 | 9/1993 |
| JP | 05251757 | 9/1993 |
| JP | 11-110897 | 4/1999 |

* cited by examiner

Primary Examiner—Karl D. Easthom
(74) Attorney, Agent, or Firm—Burns, Doane, Swecker & Mathis, L.L.P.

(57) ABSTRACT

The present invention relates to a resistive superconducting current limiter with a meandering shape. This current limiter avoids current density peaks at the turning points (12) or corners of the conductor track (10, 11) in that the central path of the fault current when limiting occurs is artificially increased by appropriate design of the turning points. For this purpose, conductor material is removed in the region of the inner edge of the turning points (13), or the electrical bypass is reinforced at its outer edge (14).

3 Claims, 1 Drawing Sheet

RESISTIVE SUPERCONDUCTING CURRENT LIMITER

FIELD OF THE INVENTION

The present invention relates to the field of applied high-temperature superconduction. It relates in particular to a resistive superconducting current limiter as claimed in the precharacterizing clause of patent claim 1.

BACKGROUND OF THE INVENTION

High-temperature superconductors are used, by way of example, in superconducting short-circuit current limiters for electrical distribution and transmission networks. A current limiter such as this makes use of the fact that a superconductor retains its superconductivity at an appropriately low operating temperature only for as long as the current density of a current flowing through it remains below a specific limit value, which is referred to as the critical current density. If a short circuit occurs in the corresponding power supply network, the current in the current limiter rises to a fault current which is greater than the critical value. This results in the superconductor changing to the resistive state, that is to say the voltage which is applied to the appropriate section of the power supply network is, at least in the short term, dropped entirely (in the event of a short circuit) or partially across the superconductor.

German Laid-Open Specification DE-A 197 46 976 describes a high-temperature superconductor arrangement for use in a current limiter. The arrangement has a superconducting layer and a perforated steel plate, which is in the form of an electrical bypass and forms a conductor assembly with the superconducting layer. In addition, the superconductor arrangement can be made mechanically robust and can be electrically insulated by means of fibre-reinforced composite materials, and is immersed in a liquid cooling medium which, for the sake of simplicity, is preferably liquid nitrogen ($LN_2$), which is thermally insulated from the environment by a vessel which is referred to as a cryostat.

DE-A 198 32 274 describes a resistive current limiter with a conductor track structure composed of high-$T_c$ superconductor material on an electrically insulating mount body. Straight conductor track sections are connected by means of annular, curved sections. The latter should have a maximum radius ratio of $r_a/r_i=7$ where $r_i$ is the inner radius of the section, and $r_a$ is the outer radius of the section. This avoids the current distribution, and hence the thermal load when limiting occurs, becoming inhomogeneous at kink points on the conductor track where the inner radii are too small. The minimum inner radius reduces the inhomogeneous local load to a tolerable level. However, at the same time, this makes the space utilization worse, that is to say the percentage of the mount body surface which is covered by the conductor track structure since, if the conductor track width is constant, the straight sections must be separated from one another by a specific minimum lateral separation at the turning points between successive, approximately parallel, straight sections.

SUMMARY OF THE INVENTION

The object of the present invention is to reduce current density peaks in a corner element between two straight conductor track sections in a resistive superconducting current limiter, when limiting occurs.

The essence of the invention is to design a conductor cross section, through which a fault current flows in the corner element when limiting occurs, at right angles to the main current direction such that it has a different conductivity and/or geometry to the corresponding conductor cross section of the straight conductor pieces. The conductor cross section referred to in this case comprises not only the high-temperature superconductor, which is normally conductive when limiting occurs, but also the electrical bypass. This conductor cross section is modified at least locally, and does not need to be uniform over the entire corner region.

For comparison purposes, the two straight conductor track sections may be considered as if they can be differentiated at all times by a "canonic connection" in the form of a circular arc. The latter should have a constant conductor cross section and, as far as possible, a minimum inner radius and, to a certain extent, represents the most obvious or most preferred connection of the two straight conductor track sections. Conductor track components of the actual corner element which are not located in the intersection region with this canonic connection contribute little to the carrying of the fault current, and only that conductor track component of the corner element which is bounded by the inner radius and outer radius of the canonic connection is considered. Its conductor cross section, which carries current when limiting occurs, differs, according to the invention, in terms of geometry and/or electrical conductivity from that of the straight conductor track sections, so that the fault current is subjected to less abrupt direction changes, without reducing the space utilization.

According to a first embodiment, the conductor assembly is removed in the intersection region on the inner edge of the canonic connection, thus enlarging the effective mean radius of the corner element in comparison to that of the canonic connection. If the conductor assembly is constructed in the form of layers, this advantageously increases the thickness of the superconducting layer since, otherwise, a reduction in the rated current level $I_N$ is unavoidable without reductions in the space utilization.

According to a further embodiment, in contrast, the superconducting layer is not changed in the intersection region, and the modification of the conductor cross section according to the invention is carried out only via the bypass. This avoids cracks being produced in the high-temperature superconductor as a result of any mechanical processing following the formation of the superconducting layer.

A centroid, with average conductivity, of the modified conductor cross section is preferably in this case located closer to the outer edge of the canonic connection, so that, once again, the effective mean radius of the corner element is enlarged, and the fault current is thus subjected to a less abrupt direction change. The centroid with average conductivity is influenced, for example, by thinning or entirely removing the bypass in the region of the inner edge. It is also possible to increase the thickness of the bypass along the outer edge, by constructing a further bypass layer. A further alternative, without influencing the geometric centroid, is based on alloying impurities to the bypass in the area of the inner edge, as a result of which its electrical resistance there is increased.

In an exemplary embodiment, a resistive superconducting current limiter having a conductor track which is applied to a mount, is composed of a conductor assembly comprising a high-temperature superconductor and an electrical bypass. The conductor track comprises two straight conductor track sections with a conductor track width b, a transverse first conductor cross section Q1 which carries current when limiting occurs, and a corner element arranged between the two straight conductor track sections. The corner element includes a circular ring section having the width b and a radial second conductor cross section Q2 which carries current when limiting occurs, and the radial second conductor cross section Q2 is different in geometry and/or conductivity from the first conductor cross section Q1. In an exemplary embodiment, a centroid, with average conductivity, of the second conductor cross section Q2 is locally closer to an outer radius than to an inner radius of the circular ring section.

BRIEF DESCRIPTION OF THE DRAWINGS

The invention will be explained in more detail in the following text using exemplary embodiments in conjunction with the drawings, in which.

The reference symbols which are used in the drawings are summarized in the list of reference symbols. In principle, identical parts are provided with the same reference symbols.

DETAILED DESCRIPTION OF THE INVENTION

Resistive current limiters based on high-temperature superconductors are preferably produced in the form of flat modules with an electrically insulating mount or substrate, and conductor tracks applied on both sides of it. The latter comprise a conductor assembly formed from a high-temperature superconductor and a metallic electrical bypass composed of silver and/or steel. During rated operation, a rated current $I_N$ flows through the superconductor. When limiting occurs, that is to say when the rated current has risen above the critical current $I_C$ of the superconductor and a voltage drop occurs in the superconductor, the bypass carries the majority of the fault current, thus reducing the load on the superconductor. The following analyses are based on the assumption that the superconductor forms a first layer, and that the bypass forms a second layer, applied to the superconductor.

In general, the conductor tracks are in the form of progressive or rectangular spiral meanders and comprise straight conductor track sections, which are connected to one another by corners or turning points of 90° or 180°. While, below the critical temperature $T_C$, the nonlinearity of the current/voltage characteristic ensures that the rated current is at all times and in all places distributed to a certain extent uniformly across the conductor cross section, an inhomogeneous current distribution can be expected at the said corners or turning points when limiting occurs. An increase in the current density at exposed points causes severe local heating of the conductor track there, and the thermal mechanical load from this can damage the superconductor.

Figure 1A:
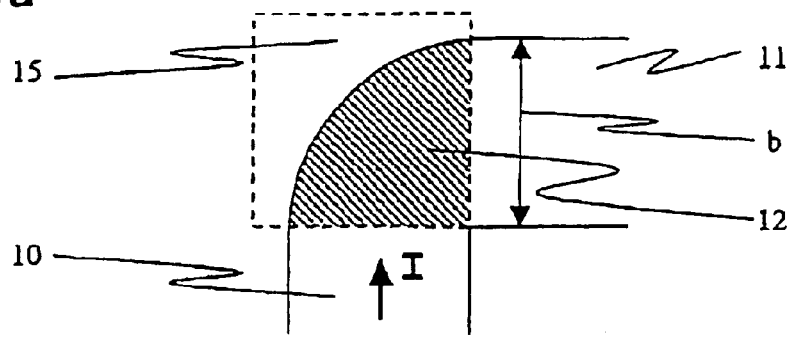
FIG. 1 shows a connection at 90°(a) and at 180°(b) between two straight conductor track sections, in the form of a plan view.
Figure 1B:
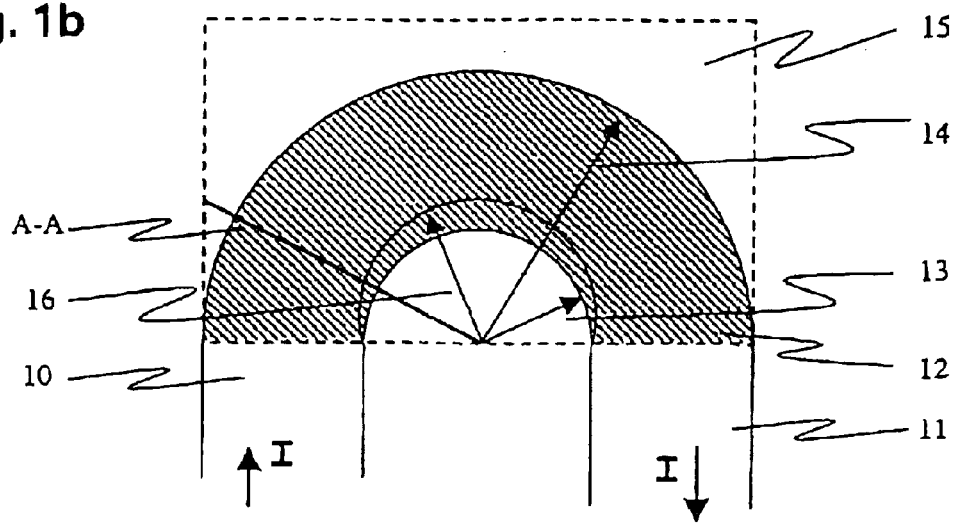

FIG. 1 shows the ends of two straight conductor track sections 10, 11 with a conductor track width b, which include an angle of 90° (FIG. 1a) or 180° (FIG. 1b) between them and through which a current I flows in a main current flow direction. In order to understand the invention better, the so-called canonic connection 12 between the two straight conductor track sections 10, 11 is also shown shaded. This forms a hypothetical conductor track section, which is in the form of a perfect circular arc and whose conductor track width is b. If the relevant ends of the two straight conductor track sections 10, 11 are not fixed from the start, the canonic inner radius 13 of the canonic connection 12 may be chosen to be as small as possible.

The extent of a corner element 15 in the plane of the conductor tracks, that is to say the lateral width of the actual connection of the two straight conductor track sections 10, 11, is in no way restricted to the area of the canonic connection 12. However, the invention considers only the intersection area which the canonic connection 12 cuts out from the corner element 15, and ignores the other areas, for example the inner semicircle in FIG. 1b. This is because, for manufacturing reasons, it is not necessarily desirable to configure the actual corner region in the form of a circular arc, so that the other areas are not removed and still provide valuable services, at least as heat sinks.

According to a first embodiment, the actual corner region 15 is designed such that an effective inner radius 16 of the conductor assembly in the intersection region is larger than the inner radius 13 of the canonic connection 12. In the plan view shown in FIG. 1b, this effective inner radius 16 is illustrated in exaggerated form, since the remaining conductor track width in the intersection region should generally still be at least 90% of the conductor track width b, locally. However, if the reduction in the conductor track width is more than 10%, it is appropriate to increase the thickness of the superconducting layer in order to avoid significant reductions in the rated current level $I_N$. The inner edges are advantageously correspondingly somewhat rounded at the junction between the straight conductor track sections 10, 11 and the corner element 15.

The increase in the inner radius in the corner region is carried out in a suitable manner at the same time by the formation of the conductor track structure, that is to say of the meander. The excess material is removed from a continuous layer of a ready-prepared superconductor by means of water-jet cutting or lasers. Alternatively, the desired structures are produced by suitable covering techniques during the application or growing of thin superconducting layers on a substrate or mount body.

Figure 2:
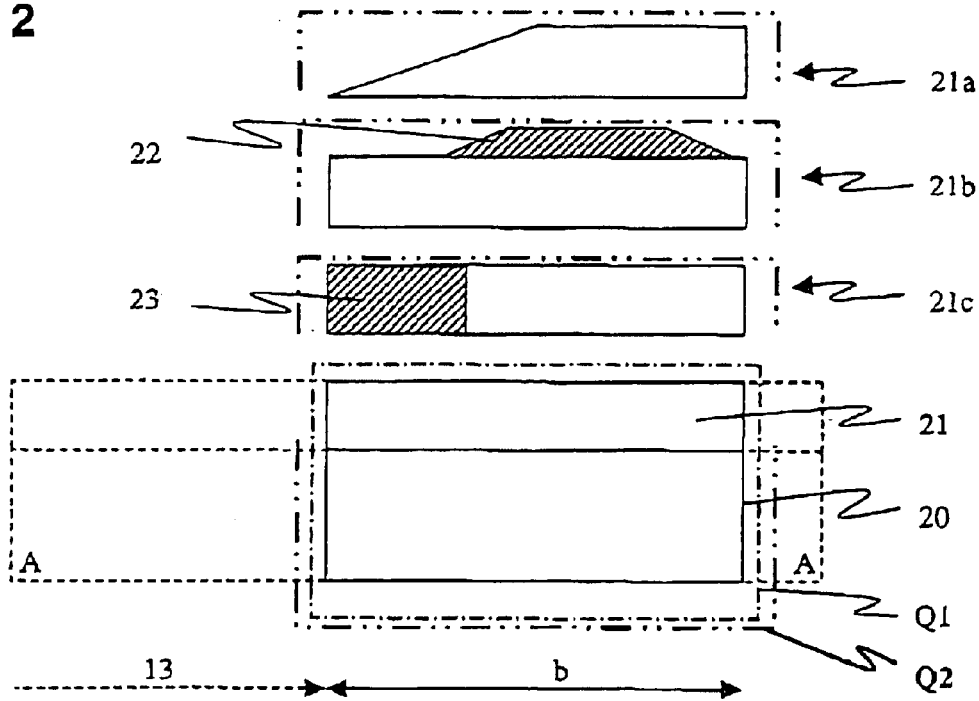
FIG. 2 shows a section through the connection shown in FIG. 1b), along the line AA, with three configurations of the electrical bypass according to the invention.

FIG. 2 shows a cross section, not to scale, along the line AA on the corner element 15 shown in FIG. 1b. A bypass layer 21 is applied to a superconducting layer 20, although the mount body which supports the two layers is not shown. That part of the corner element 15 which is not located in the intersection region with the canonic connection 12 is represented by dashed lines. The area surrounded by dashed-dotted lines and referred to as Q1 corresponds to the conductor cross section Q1, which carries current when limiting occurs, of the straight conductor track sections. In general, said conductor cross sections are always oriented at right angles to the main current flow direction, that is to say transversely for the straight conductor sections 10, 11 and radially for the canonic connection 12, that is to say in the section plane shown in FIG. 2.

In this embodiment, the mean path of the fault current when limiting occurs is enlarged only by appropriate modification of the bypass in the corner region. Appropriate alternative configurations of the bypass 21 are shown in FIG. 2 by solid lines above the conductor cross section Q1, which carries current when limiting occurs. The superconductor 20 is identical for all the described cases and is the same as that of the unchanged conductor cross section Q1. In the topmost version, the bypass 21a is designed to be thinner on the inside than on the outside, in which case the reduction in the bypass layer thickness may go as far as complete removal of the bypass material. In the central version, a second bypass layer 22 having a larger inner radius is applied to the first bypass 21b. The third version is distinguished by an alloying region 23 with an increased specific resistance along the inner edge of the bypass 21c. The three measures which have been mentioned enlarge the effective minimum radius of the corner element 15 by a factor of up to two, depending on the conductor track geometry, in comparison to the canonic inner radius 13. Owing to the lack of the said nonlinearity of the current/voltage characteristic when limiting occurs, this effective minimum radius of the corner element 15 is also more or less identical to an effective mean radius in the corner region.

The second bypass layer 22 is applied to the first bypass layer 21b by means of flame spraying, electrochemical deposition (silver plating), vapor deposition or by soldering it on. Alternatively, the former is created by selective removal of a metal foil that is required in the production process. In particular, such a second bypass 22 may also be located on the other side of the superconductor 20. Typical layer thicknesses for second bypass layers composed of silver or copper are 100 µm. This firstly reduces the electrical resistance in the outer turning point region so that less Joulean heat is produced there while, on the other hand, this improves the dissipation of this heat to a cold reservoir or to other areas of the arrangement.

Particularly in the case of fusion-processed $Bi_2Sr_2CaCu_2O_x$ high-temperature superconductive material, in the cases described above, the bypass 21a, b, c is advantageously completely structured in advance, and is then joined to the already-processed superconductor. The latter process is carried out by adhesive bonding or soldering, without any mechanical load on the superconductor. Typical conductor track widths b in this case are 20 mm, and the lateral separation ($\equiv 2r_i$) between two parallel straight conductor track sections in a progressive meander is less than 3 mm.

The above statements apply not only to fusion-processed BSCCO, but also to epitaxial YBCO layer structures and even to wires. In fact, specifically, other geometries are also feasible, and, by way of example, it is possible to surround the superconductor by the bypass on all sides, or to break it down into individual filaments embedded in the bypass. In consequence, the problem of current density peaks occurs, even if only to a lesser extent, in the case of direction changes which are indefinitely small between two successive straight conductor track sections as well, so that the solutions proposed here are in no way restricted to 90° or 180° turning points.

List Of Reference Symbols
 First straight conductor track section
 11 Second straight conductor track section
 12 Canonic connection
 13 Canonic inner radius
 14 Canonic outer radius
 15 Corner element
 16 Effective inner radius
 20 Superconducting layer
 21 Bypass layer
 22 Second bypass layer
 23 Alloying region
 b Conductor track width
 Q1 First conductor cross section
 Q2 Second conductor cross section

What is claimed is:

1. A resistive superconducting current limiter comprising
two straight conductor track sections each having a conductor track width b and a transverse first conductor cross section Q1 which carries current when limiting occurs; and
a corner element arranged between the two straight conductor track sections;
wherein the corner element includes a circular ring section having the width b and a radial second conductor cross section Q2 which carries current when limiting occurs;
wherein each of the two straight conductor track sections and the corner element includes a layer of high-temperature superconductor and an electrical bypass;
wherein the radial second conductor cross section Q2 is different in geometry and/or conductivity from the first conductor cross section Q1.
wherein, in the circular ring section, the superconducting layer is unchanged from the straight conductor track sections;
wherein a centroid, with average conductivity, of the second conductor cross section Q2 is locally closer to an outer radius than to an inner radius of the circular ring section; and
wherein the bypass is thinner along the inner radius than along the outer radius of the circular ring section.

2. A resistive superconducting current limiter comprising
two straight conductor track sections each having a conductor track width b and a transverse first conductor cross section Q1 which carries current when limiting occurs; and
a corner element arranged between the two straight conductor track sections;
wherein the corner element includes a circular ring section having the width b and a radial second conductor cross section Q2 which carries current when limiting occurs;
wherein each of the two straight conductor track sections and the corner element includes a layer of high-temperature superconductor and an electrical bypass;
wherein the radial second conductor cross section Q2 is different in geometry and/or conductivity from the first conductor cross section Q1,
wherein, in the circular ring section, the superconducting layer is unchanged from the straight conductor track sections;
wherein a centroid, with average conductivity, of the second conductor cross section Q2 is locally closer to an outer radius than to an inner radius of the circular ring section; and
wherein a second bypass layer is applied on the bypass, along the outer radius of the circular ring section.

3. A resistive superconducting current limiter comprising
two straight conductor track sections each having a conductor track width b and a transverse first conductor cross section Q1 which carries current when limiting occurs; and
a corner element arranged between the two straight conductor track sections;
wherein the corner element includes a circular ring section having the width b and a radial second conductor cross section Q2 which carries current when limiting occurs;
wherein each of the two straight conductor track sections and the corner element includes a layer of high-temperature superconductor and an electrical bypass;
wherein the radial second conductor cross section Q2 is different in geometry and/or conductivity from the first conductor cross section Q1,
wherein, in the circular ring section, the superconducting layer is unchanged from the straight conductor track sections;
wherein a centroid, with average conductivity of the second conductor cross section Q2 is locally closer to an outer radius than to an inner radius of the circular ring section; and
wherein the bypass is alloyed along the inner radius of the circular ring section.

* * * * *